United States Patent
Chen et al.

(10) Patent No.: US 12,016,167 B2
(45) Date of Patent: Jun. 18, 2024

(54) TEAR-DROP SHAPED HDD CARRIER EMI FINGER

(71) Applicant: Dell Products L.P., Round Rock, TX (US)

(72) Inventors: Yu-Lin Chen, Taipei (TW); Yueh-Chun Tsai, Taipei (TW); Chun-Cheng Lin, New Taipei (TW); Chi-Feng Lee, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/717,355

(22) Filed: Apr. 11, 2022

(65) Prior Publication Data

US 2023/0328941 A1 Oct. 12, 2023

(51) Int. Cl.
*H05K 9/00* (2006.01)

(52) U.S. Cl.
CPC ......... *H05K 9/0062* (2013.01); *H05K 9/0007* (2013.01)

(58) Field of Classification Search
CPC .................. H05K 9/0062; H05K 9/0007
USPC .................................................. 361/679.33
See application file for complete search history.

(56) References Cited

U.S. PATENT DOCUMENTS

| | | | |
|---|---|---|---|
| 6,534,706 B1 | 3/2003 | Rapp et al. | |
| 7,280,352 B2 | 10/2007 | Wilson et al. | |
| 2004/0095716 A1* | 5/2004 | McAlister | G06F 1/184 361/679.33 |
| 2005/0270737 A1* | 12/2005 | Wilson | G11B 33/126 |
| 2008/0205026 A1* | 8/2008 | Gallarelli | G11B 33/12 361/818 |
| 2009/0086421 A1* | 4/2009 | Olesiewicz | H05K 9/0016 361/679.33 |
| 2017/0269644 A1* | 9/2017 | Kwon | G11B 33/08 |
| 2020/0097054 A1* | 3/2020 | Lin | G06F 13/4081 |

* cited by examiner

*Primary Examiner* — Zhengfu J Feng
(74) *Attorney, Agent, or Firm* — Larson Newman, LLP

(57) ABSTRACT

A carrier assembly for mounting equipment into a carrier slot includes an electro-magnetic interference (EMI) shield and an EMI finger. The EMI shield protects the mounted equipment from EMI. The EMI shield is formed in a first plane of the carrier assembly. The EMI finger protrudes from the EMI shield and is coupled to the EMI shield. The EMI finger is formed in a second plane perpendicular to the first plane. The EMI finger operates, when the carrier assembly is installed into the carrier slot, to couple the EMI shield to the carrier slot. The EMI finger, when viewed from a first direction that is perpendicular to both the first plane and the second plane, is formed in a tear-drop shape.

20 Claims, 5 Drawing Sheets

Side

Front

Front

TEAR-DROP SHAPED HDD CARRIER EMI FINGER

FIELD OF THE DISCLOSURE

This disclosure generally relates to information handling systems and more particularly relates to tear-drop shaped hard disk drive carrier EMI finger design.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A carrier assembly for mounting equipment into a carrier slot ay include an electro-magnetic interference (EMI) shield and an EMI finger. The EMI shield may protect the mounted equipment from EMI. The EMI shield may be formed in a first plane of the carrier assembly. The EMI finger may protrude from the EMI shield and may be coupled to the EMI shield. The EMI finger may be formed in a second plane perpendicular to the first plane. The EMI finger may operate, when the carrier assembly is installed into the carrier slot, to couple the EMI shield to the carrier slot. The EMI finger, when viewed from a first direction that is perpendicular to both the first plane and the second plane, may be formed in a tear-drop shape.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
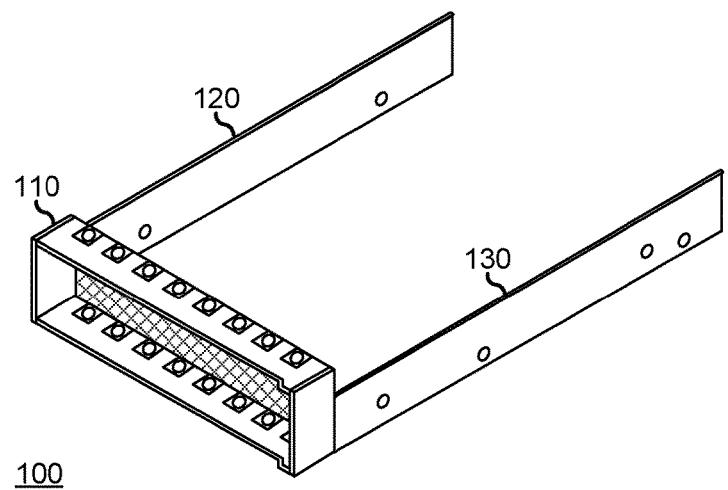
FIG. 1 illustrates a hard disk driver (HDD) carrier according to an embodiment of the current disclosure.

FIG. 1 illustrates a hard disk drive (HDD) carrier 100. HDD carrier 100 includes a carrier front assembly 110, a carrier left side bracket 120, and a carrier right side bracket 130. HDD carrier 100 represents an adapter configured to mount standard 3.5 inch or 2.5 inch data storage devices, such as HDDs or solid state drives (SSDs) within a server enclosure. As such, HDD carrier 100 provides a mounting mechanism in side brackets 120 and 130 for mounting the data storage devices, and provides for plug-in compatibility with a matching HDD slot (not illustrated). Here, a standard data storage device can be mounted into HDD carrier 100, and the HDD carrier can be plugged into the HDD slot. At the back of the slot, standard connectors are provided such that, when fully plugged into the HDD slot, the data storage device is fully connected, both for power and for signal connections, to the information handling system that includes the HDD slot, and is securely maintained within the HDD slot. In this regard, HDD carrier 100 will typically include a front mounting/latch kit (not illustrated) mounted to carrier front assembly 110 that, when engaged with the HDD slot, fully connects the connectors and locks the HDD carrier into the HDD slot. The fabrication, construction, and assembly of HDD carriers is known in the art and will not be further described herein, except as needed to illustrate the current embodiments.

Figure 2:
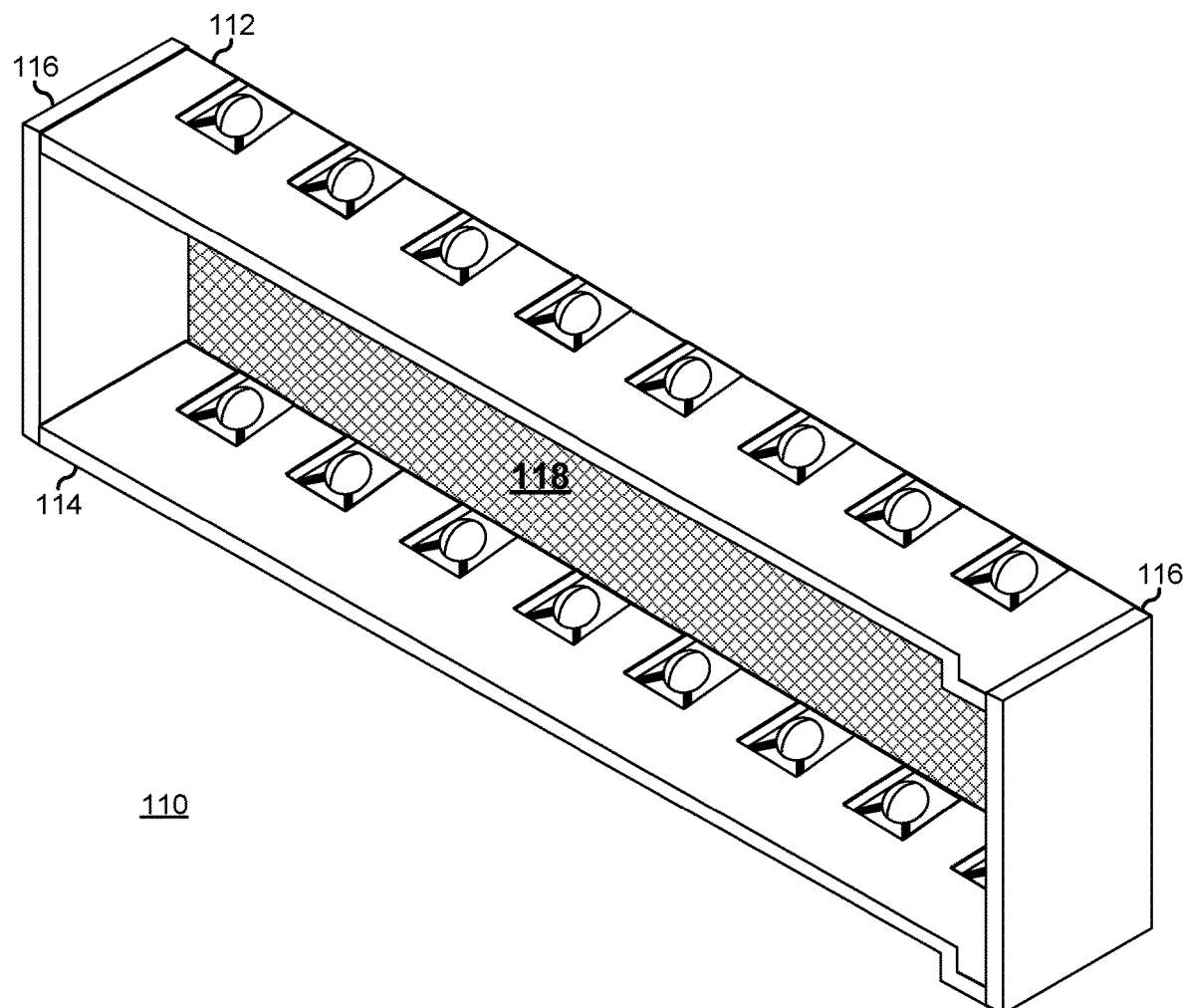
FIG. 2 illustrates a carrier front assembly of the HDD carrier of FIG. 1.
Figure 3:
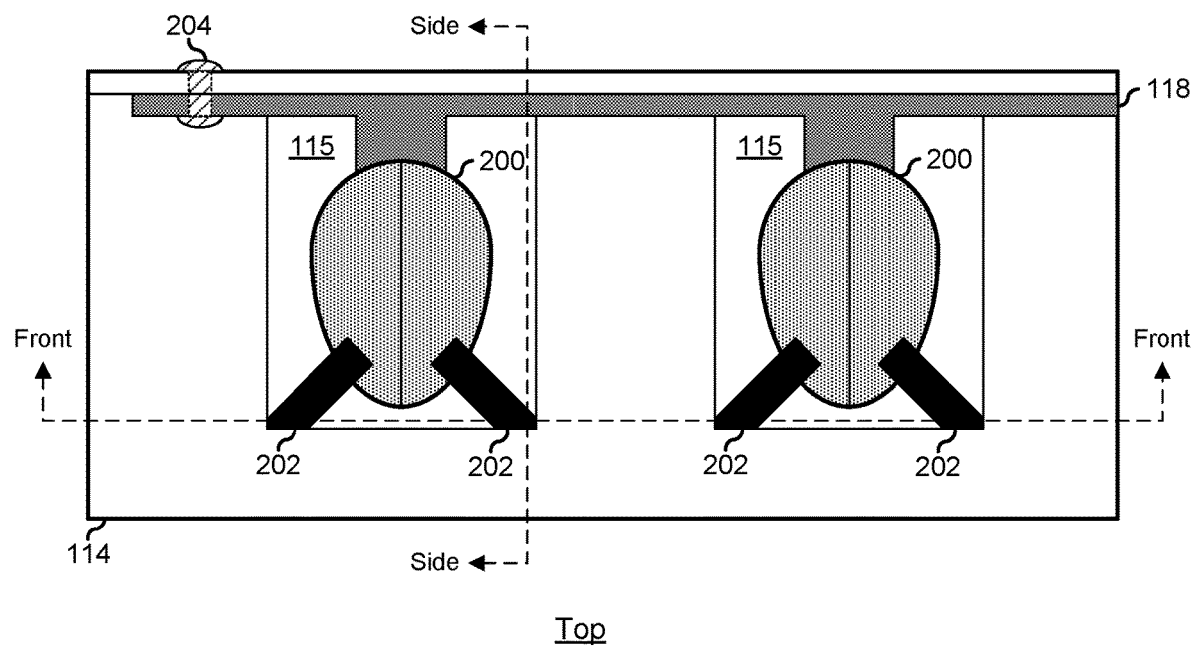
FIGS. 3-5 illustrate top-, front-, and side-views of a portion of the front assembly of the HDD carrier of FIG. 1.
Figure 4:
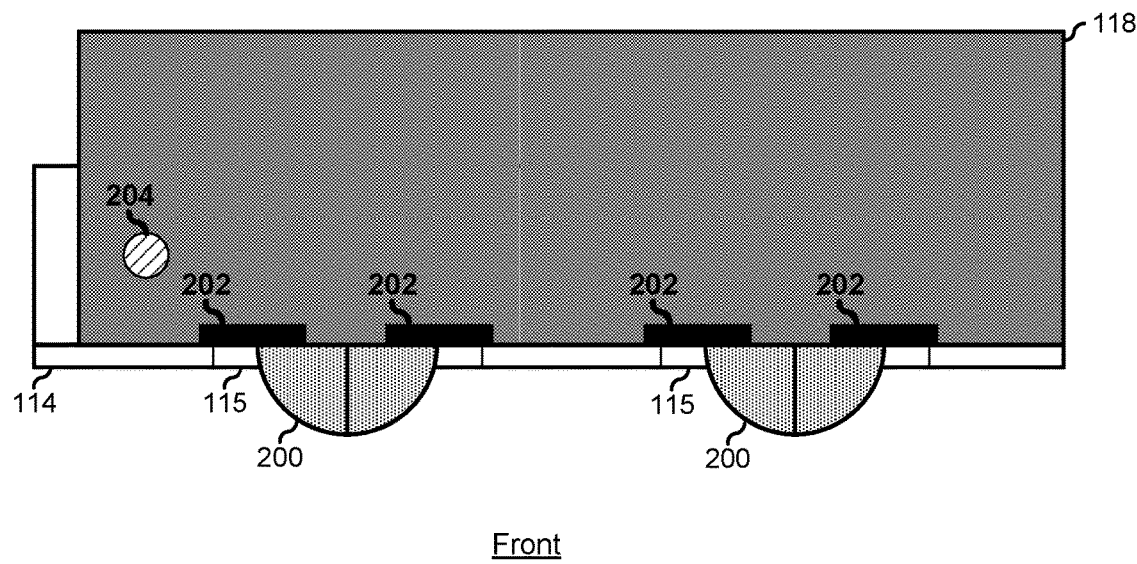
Figure 5:
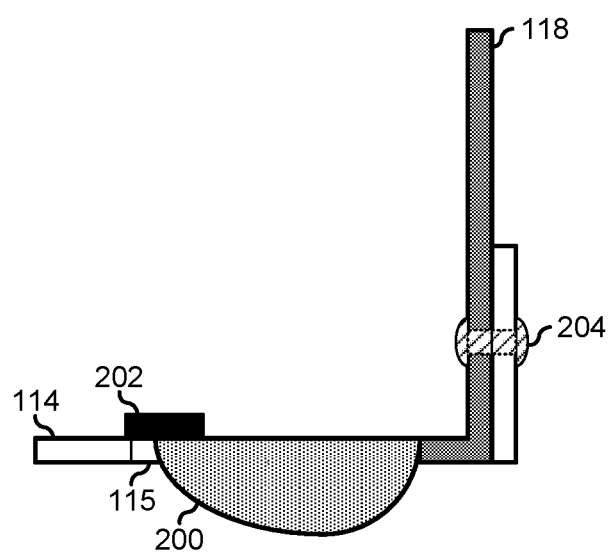

FIG. 2 illustrates carrier front assembly 110, including a top member 112, a bottom member 114, side members 116, and an attached electro-magnetic interference (EMI) shield 118. Carrier front assembly 110 may be fabricated from one or more stamped piece parts of sheet metal or another suitable material, as needed or desired. top, bottom, and side members 112, 114, and 116 may be affixed together by fasteners, such as rivets, screws, bolts, or the like, or by any other fastening as may be known in the art. Moreover, side members 116 may be fabricated as separate piece parts from brackets 120 and 130, or may be integrated as single members, as needed or desired. FIGS. 3-5 illustrate top-, front-, and side-views, respectively, of selected portions of bottom member 114 and of EMI shield 118, with further details as described below. Here, it will be understood that top member 112 may include similar features as described below, as needed or desired.

FIG. 3 illustrates a top view of a portion of bottom member 114 and EMI shield 118. Here, bottom member 114 is illustrated as having one or more cut-out portions 115 that form holes in the bottom member in the horizontal plane of the bottom member. Each cut-out portion 115 is associated with an EMI finger 200 that is conductively affixed to EMI shield 118. Bottom member 114 and EMI shield 118 are rigidly affixed to each other by a rivet 204. Here, it will be understood that bottom member 114 and EMI shield 118 may be rigidly affixed to each other by another attachment, such as a glue, a weld, a solder, or any other suitable attachment as may be known in the art.

EMI fingers are typically provided in HDD carriers to provide a conductive contact to the HDD slot to form a shield structure that blocks harmful emissions from the enclosed HDD. The EMI fingers typically extend beyond the profile of the HDD carrier. That is, where EMI fingers are located on a top member of the HDD carrier, the EMI fingers extend above the profile of the HDD carrier, and where EMI fingers are located on a bottom member of the HDD carrier, the EMI fingers extend below the profile of the HDD carrier. Then, the HDD carrier is inserted into the adjacent HDD slot, the EMI fingers come into physical contact with the HDD slot, and the EMI shield is formed. It will be understood that typical EMI fingers may be formed of a flat, rectangular piece of metal that is bent to form an arc, the arc extending beyond the profile of the HDD carrier, as described further below.

Each EMI finger 200 is illustrated as floating within the hole formed by the associated cut-out portion 115, being held in place by the attachment point to EMI shield 118. Here, when HDD carrier 100 is inserted into a HDD slot, EMI fingers 200 engage with, and provide an electrical contact with the HDD slot. In engaging with the HDD slot, EMI fingers 200 may be understood to flex upward into cut-out portion 115, the flexing providing a positive engagement with the HDD slot to form a sound electrical contact between the EMI fingers and the HDD slot. EMI fingers 200 are partially restrained in a vertical direction by one or more hard stop 202 rigidly formed from, or otherwise attached to bottom member 114. In a particular embodiment, EMI finger 200 is not rigidly attached to hard stop 202. In this way, EMI finger 200 is partially restrained from flexing upward into cut-out portion 115, thereby increasing the contact pressure to the adjacent HDD carrier, but the EMI finger remains free to flex downward toward the HDD slot. In another embodiment, EMI finger 200 is rigidly attached to hard stop 202. In this way, in addition to being partially restrained form flexing upward into cut-out portion 115, EMI finger 200 is restrained from flexing downward toward the HDD slot. In particular, where EMI finger 200 is rigidly attached to hard stop 202, the EMI finger is prevented from being bent out of its normal alignment by a faulty insertion of HDD carrier 100 into the HDD slot. In another embodiment, one or more additional hard stops similar to hard stop 202 is provided for each EMI finger 200, as needed or desired. In a particular embodiment, hard stop 202 is formed from bottom member 114. In another embodiment, hard stop 202 is a separate element from bottom member 114, and is affixed to a top side of the bottom member or to a bottom side of the bottom member, as needed or desired. Note that, in the top view depicted in FIG. 3, EMI finger 200 is shown as having a tear-drop shape. In another embodiment, as viewed from the top, EMI finger 200 may have a circular shape, as needed or desired. FIG. 3 also shows a front cut-away section, as shown in FIG. 4, and described below, and a side cut-away section, as shown in FIG. 5, and described below.

FIG. 4 illustrates the front view of the portion of bottom member 114 and EMI shield 118. Here, hard stop 202 will be understood to be rigidly attached to bottom member 114, and will be seen to restrain EMI finger 200 in the upward vertical direction. Moreover, if hard stop 202 is rigidly attached to EMI finger 200, then the EMI finger is prevented from being bent downward out of its normal alignment. In the front view, EMI finger 200 is depicted as having a hemispherical profile. In another embodiment, as viewed from the front, EMI finger 200 may have a domed shape, or some portion of a circular arc shape that is less than a hemispherical profile, as needed or desired.

FIG. 5 illustrates the side view of the portion of bottom member 114 and EMI shield 118. In the side view, EMI finger 200 is depicted as having a half-tear-drop shape. In another embodiment, as viewed from the side, EMI finger 200 may have a domed shape, some portion of a circular arc shape that is less than a hemispherical profile, of some portion of a half-tear-drop shape that is less than the depicted half-tear-drop shape, as needed or desired.

Figure 6:
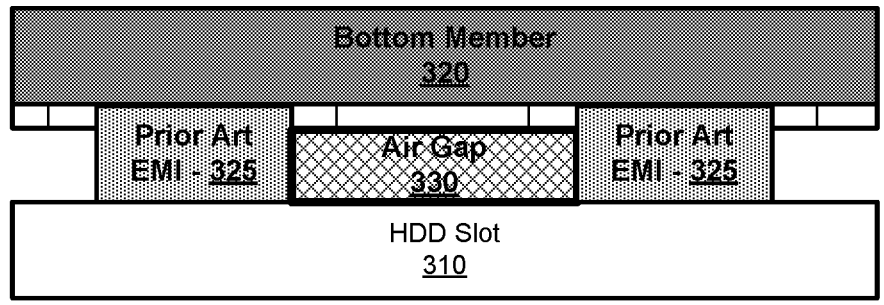
FIG. 6 illustrates a front-view of a portion of a front assembly of HDD carriers of the prior art.

FIG. 6 illustrates a front view 300 of a prior art EMI finger arrangement. Front view 300 depicts a portion of a HDD slot 310 with an HDD carrier installed into the HDD carrier. The HDD carrier is represented by a portion of a bottom member 320 and associated EMI fingers 325 as may be typical of the prior art. EMI fingers 325 are depicted as having a rectangular profile. For example, EMI fingers 325 may be formed of a flat, rectangular piece of metal that is bent to form an arc, the arc extending below bottom member 320, as shown. Here, EMI fingers 325 are understood to provide a barrier to air flow as may be established by one or more fan of the information handling system into which the HDD carrier is installed. However, the space between EMI fingers 325 provide an air gap 330 through which the air flow may be drawn by the fan.

Figure 8:
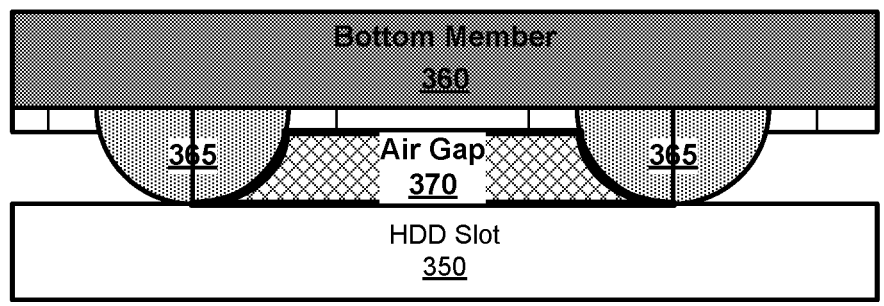
FIG. 8 illustrates a front-view of a portion of a front assembly of HDD carriers according to an embodiment of the current disclosure.

FIG. 8 illustrates a front view 340 of an embodiment of an EMI finger arrangement depicting a portion of a HDD slot 350 with an HDD carrier installed into the HDD carrier. The HDD carrier is represented by a portion of a bottom member 360 and associated EMI fingers 365, similar to EMI fingers 200 as described above. In particular, EMI fingers 365 are depicted as having a hemispherical profile. Here, EMI fingers 365 are likewise understood to provide a barrier to air flow as may be established by one or more fan of the information handling system into which the HDD carrier is installed. However, the space between EMI fingers 365 provide an air gap 370 through which the air flow may be drawn by the fan. It will be understood that air gap 330 is smaller than air gap 370. Hence EMI fingers similar to EMI fingers 200 or EMI fingers 365 may be understood to permit greater air flow over the installed data storage device than may be had utilizing prior art EMI fingers 325.

It will be understood that EMI fingers 325 are typically formed of a thin sheet metal, and as such, the edges of the prior art EMI fingers may be sharp and/or rough due to a stamping process by which the prior art EMI fingers are formed. Such sharp and/or rough edges may lead to scratching of the surface of the storage device when the prior art HDD carrier is installed into the HDD slot. In particular, in some embodiments, there may be no cross member of a HDD slot. Instead, adjacent HDD carriers may be stacked directly upon each other. In this case, the insertion of a HDD carrier into a HDD slot may expose the data storage device being inserted to the sharp and/or rough edges of the prior art EMI fingers of the adjacent HDD carrier, thereby subjecting the data storage device to scratching by the prior art EMI fingers. In contrast, where a HDD carrier employs EMI fingers similar to EMI fingers 200 or EMI fingers 265, it will be seen that the point of contact between the EMI fingers of the current disclosure, and any adjacent data storage devices, is a smoothly rounded contact point. Therefore the EMI fingers of the current disclosure, such as EMI fingers 200 or EMI fingers 365 will not scratch the adjacent data storage devices upon insertion of the HDD carrier into the HDD slot.

The EMI fingers of the current disclosure, such as EMI fingers 200 or EMI fingers 365 are depicted in the context of HDD carriers and HDD slots, but this is not necessarily so. In other embodiments, EMI fingers similar to EMI fingers 200 or EMI fingers 365 may be utilized for other types of pluggable modules. For example, EMI fingers similar to EMI fingers 200 or EMI fingers 365 may be utilized Enterprise and Datacenter SSD Form Factor (EDSFF) enclosures, or other types of enclosures that utilize EMI fingers, as needed or desired.

Figure 7:
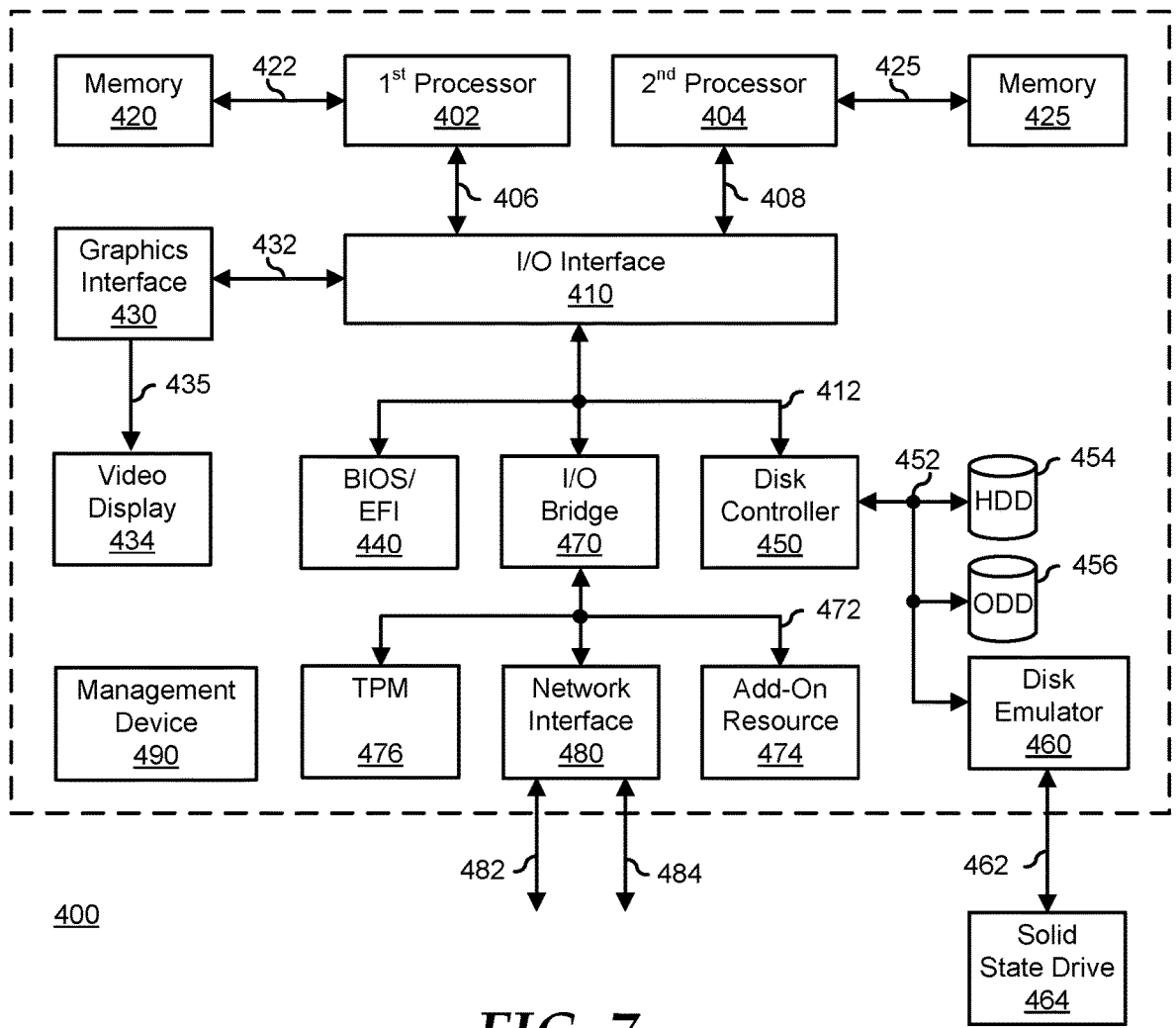
FIG. 7 is a block diagram illustrating a generalized information handling system according to another embodiment of the present disclosure.

FIG. 7 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (00B) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A carrier assembly for mounting equipment into a carrier slot, the carrier assembly comprising:
    an electro-magnetic interference (EMI) shield configured to protect the mounted equipment from EMI, the EMI shield being formed in a first plane of the carrier assembly; and
    an EMI finger protruding from the EMI shield and coupled to the EMI shield, the EMI finger being formed in a second plane perpendicular to the first plane, wherein the EMI finger operates, when the carrier assembly is installed into the carrier slot, to couple the EMI shield to the carrier slot, and wherein the EMI finger, when viewed from a first direction that is perpendicular to a largest face of the equipment configured to be mounted in the carrier assembly, is formed in a tear-drop shape.

2. The carrier assembly of claim 1, further comprising:
    a structural member attached to the EMI shield, the structural member configured to provide a hard stop that limits a movement of the EMI finger in a second direction perpendicular to the second plane.

3. The carrier assembly of claim 2, wherein the hard stop is affixed to the EMI finger to further limit the movement of the EMI finger in a third direction opposite to the second direction.

4. The carrier assembly of claim 2, wherein the EMI finger protrudes through a cut-out in the structural member.

5. The carrier assembly of claim 1, wherein the EMI finger, when viewed from a second direction associated with an insertion of the carrier assembly into the carrier slot, has a hemispherical profile.

6. The carrier assembly of claim 1, wherein the EMI finger, when viewed from a second direction associated with an insertion of the carrier assembly into the carrier slot, has a circular arc shape that is less than a hemispherical profile.

7. The carrier assembly of claim 1, wherein the EMI finger, when viewed from a second direction associated with an insertion of the carrier assembly into the carrier slot, has a dome-shaped profile.

8. The carrier assembly of claim 1, wherein the carrier assembly is a hard-disk drive (HDD) carrier.

9. The carrier assembly of claim 1, wherein the carrier assembly is an Enterprise and Datacenter SSD Form Factor (EDSFF) carrier.

10. A method for mounting equipment installed into a carrier assembly into a carrier slot, the method comprising:
    forming, on the carrier assembly, an electro-magnetic interference (EMI) shield configured to protect the mounted equipment from EMI, the EMI shield being formed in a first plane of the carrier assembly;

extending, from the EMI shield, an EMI finger, the EMI finger being formed in a second plane perpendicular to the first plane, and wherein the EMI finger, when viewed from a first direction that is perpendicular to a largest face of the equipment configured to be mounted in the carrier assembly, is formed in a tear-drop shape; and coupling the EMI finger to the EMI shield, wherein the EMI finger operates, when the carrier assembly is installed into the carrier slot, to couple the EMI shield to the carrier slot.

11. The method of claim 10, further comprising:

attaching a structural member to the EMI shield, the structural member configured to provide a hard stop that limits a movement of the EMI finger in a second direction perpendicular to the second plane.

12. The method of claim 11, wherein the hard stop is affixed to the EMI finger to further limit the movement of the EMI finger in a third direction opposite to the second direction.

13. The method of claim 11, wherein the EMI finger protrudes through a cut-out in the structural member.

14. The method of claim 10, wherein the EMI finger, when viewed from a second direction associated with an insertion of the carrier assembly into the carrier slot, has a hemispherical profile.

15. The method of claim 10, wherein the EMI finger, when viewed from a second direction associated with an insertion of the carrier assembly into the carrier slot, has a circular arc shape that is less than a hemispherical profile.

16. The method of claim 10, wherein the EMI finger, when viewed from a second direction associated with an insertion of the carrier assembly into the carrier slot, has a dome-shaped profile.

17. The method of claim 10, wherein the carrier assembly is a hard-disk drive (HDD) carrier.

18. The method of claim 10, wherein the carrier assembly is an Enterprise and Datacenter SSD Form Factor (EDSFF) carrier.

19. A hard disk drive (HDD) carrier assembly for mounting a HDD into a HDD slot, the carrier assembly comprising:

an electro-magnetic interference (EMI) shield configured to protect the HDD from EMI, the EMI shield being formed in a first plane of the HDD carrier assembly; and an EMI finger protruding from the EMI shield and coupled to the EMI shield, the EMI finger being formed in a second plane perpendicular to the first plane, wherein the EMI finger operates, when the carrier assembly is installed into the HDD slot, to couple the EMI shield to the HDD slot, wherein the EMI finger, when viewed from a first direction that is perpendicular to a largest face of the HDD configured to be mounted in the carrier assembly, is formed in a tear-drop shape.

20. The HDD carrier assembly of claim 19, further comprising:

a structural member attached to the EMI shield, the structural member configured to provide a hard stop that limits a movement of the EMI finger in a second direction perpendicular to the second plane.

* * * * *